United States Patent [19]

Chen

[11] Patent Number: 5,570,049

[45] Date of Patent: Oct. 29, 1996

[54] TRANSCONDUCTOR ELEMENT FOR HIGH SPEED GM-C INTEGRATED FILTERS

[75] Inventor: Xiaole Chen, Milpitas, Calif.

[73] Assignee: Exar Corporation, San Jose, Calif.

[21] Appl. No.: 453,413

[22] Filed: May 30, 1995

[51] Int. Cl.$^6$ ........................................................ H03F 3/45
[52] U.S. Cl. .......................... 327/103; 327/552; 327/560
[58] Field of Search ................................ 327/103, 552, 327/553, 336, 551, 563, 560; 330/303

[56] References Cited

U.S. PATENT DOCUMENTS

| | | | |
|---|---|---|---|
| 4,855,626 | 8/1989 | Böhme | 327/336 |
| 5,223,743 | 6/1993 | Nakagawora | 327/103 |
| 5,227,681 | 7/1993 | Koyama et al. | 327/336 |
| 5,357,208 | 10/1994 | Nelson | 327/553 |
| 5,418,483 | 5/1995 | Hiroshi | 327/553 |
| 5,444,414 | 8/1995 | Delano | 327/552 |
| 5,448,190 | 9/1995 | Etoh | 327/103 |

OTHER PUBLICATIONS

S. L. Wong, et al., "Voltage Gain Enhancement by Conductance Cancellation in CMOS OP AMPS," Proc. IEEE ISCAS '84, Department of Electrical Engineering, University of Toronto, pp. 1207–1210.

B. Nauta, "A CMOS Transconductance–C Filter Technique for Very High Frequencies," IEEE Journal of Solid State Circuits, vol. SC–27, No. 2, pp. 142–153 (Feb., 1992).

J. C. Park, R. Mittal, K. C. Bracken, R. Carley, and D. J. Allstot, "High Speed CMOS Current–Mode Decision Feedback Equalizers," Department of Electrical and Computer Engineering, Carnegie Mellon University, 4 pp.

S. Lee, R. H. Zele, D. J. Allstot, and G. Liang, "CMOS Continuous–Time Current–Mode Filters for High–Frequency Applications," IEEE Journal of Solid State Circuits, vol. 28, No. 3, pp. 323–328 (Mar., 1993).

G. A. De Veirman, "Monolithic 10–30 MHz Tunable Bipolar Bessel Lowpass Filter," Proc. IEEE ISCAS, pp. 1444–1447 (1991).

*Primary Examiner*—Timothy P. Callahan
*Assistant Examiner*—Eunja Shin
*Attorney, Agent, or Firm*—Townsend and Townsend and Crew LLP

[57] ABSTRACT

A circuit technique for improving high frequency performance of current-controlled transconductor elements in transconductance-capacitance ($g_m$–C) based monolithic filters. The circuit detects the output impedance of the transconductance transistors inside the transconductor element, regenerates and applies a negative conductance to the output of the transconductor. By cancelling the transistor output impedance, the total differential mode output impedance of the transconductor element can be maximized.

7 Claims, 3 Drawing Sheets

TRANSCONDUCTOR ELEMENT FOR HIGH SPEED GM-C INTEGRATED FILTERS

BACKGROUND OF THE INVENTION

The present invention relates in general to integrated filters, and in particular to high frequency transconductor-capacitor ($g_m$–C) integrated filters.

A transconductor is an element that delivers an output current proportional to the input signal voltage: $i=g_m*V_{in}$, where $g_m$ is the transconductance of the element. When a capacitor is connected to the output of a transconductor, an integrator is obtained: $V_o/V_{in}=g_m*(1/sC)$. Monolithic filters may thus be implemented using the $g_m$–C integrator.

In high-frequency $g_m$–C filters the most important building block is the transconductor element. Various circuit implementations of the transconductor element have been proposed to optimize various aspects of its performance characteristics including linearity, speed, and input dynamic range. The bipolar transistor, for example, has higher transconductance than that of metal-oxide-semiconductor (MOS) transistor and therefore exhibits higher bandwidth. However, bipolar transistor-based transconductors have limited input dynamic range. The MOS transconductor on the other hand enjoys a larger input linear range, but it also suffers from a limited input dynamic range.

FIG. 1 shows a pair of MOS inverters that when biased in the saturation region implement a differential transconductor. This transconductor uses the quadratic relation between the drain current and the gate-to-source voltage of an MOS transistor to realize linear performance. The drain currents of an n-channel and a p-channel MOS transistor in saturation are given by:

$$i_{dn}=(\mu_0 C_{ox}/2)(W_n/L_n)(v_{gsn}-v_{tn})^2=(\beta_n/2)(v_{gsn}-v_{tn})^2$$

$$i_{dp}=(\mu_0 C_{ox}/2)(W_p/L_p)(v_{gsp}-v_{tp})^2=(\beta_p/2)(v_{gsp}-v_{tp})^2$$

Thus, the differential output current in terms of the differential input voltage is:

$$i_{out}=v_i(v_{cc}-v_{tn}+v_{tp})\sqrt{\beta_n\beta_p}$$

This yields a perfect linear relation between the input voltage, $V_i=V_{ip}-V_{in}$, and the output current $i_{out}$. The inverter-based transconductor has a perfect linearity performance if other secondary effects are neglected. One drawback of this transconductor is that the frequency tuning of the filter must be performed by changing the supply voltage $V_{cc}$. This requires a voltage regulator and associated compensation network, which increases the minimum power supply voltage and limits the frequency response of the filter.

FIG. 2 shows a schematic of a current controlled differential transconductor. The major difference between this circuit and the inverter based transconductor of FIG. 1 is that two current sources are used here to bias the transconductor so that the corner frequency can be controlled by current rather than the supply voltage. Transistors M2 and M3 have been added to minimize the common-mode and maximize the differential-mode output impedance. This implementation eliminates the required supply voltage control circuitry and the associated compensation network. The performance of this transconductor is, however, highly dependent on the output impedance of transistors M1, M2, and M3. The transfer function of an ideal integrator (with infinite output impedance) has a pole at zero frequency which introduces a –90 degrees phase shift. The effect of finite output impedance is to move the pole from zero to a finite frequency, causing an undesired phase shift in the frequency response of the integrator. Thus, it is critical to maximize the differential output impedance of the transconductor.

The differential output impedance of the transconductor of FIG. 2 is given by:

$$R_{out}=[1/(g_{m2}+\Sigma g_{ds1,2,3}-g_{m3})]$$

where, $g_{m2}$ and $g_{m3}$ are the transconductances of MOS transistors M2 and M3, and the term $\Sigma g_{ds1,2,3}$ represents the sum of output conductances ($g_{ds}$) for transistors M1, M2, and M3. Therefore, to obtain infinite differential output impedance for the integrator, the sizes of transistors M1, M2, and M3 should be scaled such that the terms in the denominator of the $R_{out}$ equation cancel out. While an approximate cancellation may be achieved to a first degree, the performance of the integrator suffers from secondary effects. For example, the output conductance $g_{ds}$ of an MOS transistor does not track gm as the bias current varies. There may be as much as 2% to 5% variation in the ratio of $gm/g_{ds}$ at different current levels. Also, the $g_{ds}$ of an MOS transistor does not track $g_m$ over temperature and process variations. Thus, the performance of an integrator based on the transconductor element of FIG. 2 is adversely affected by a finite and variable transistor output impedances.

A conventional approach to increasing the differential output impedance of the transconductor of FIG. 2 is to add a second level of transistors (M1', M2', and M3') in a cascode connection. While the cascode transistors exhibit higher output impedance, the structure adds an extra node (cascode node) in the signal path which causes undesirable high frequency phase shift.

There is therefore a need for an improved transconductor circuit for high frequency filtering applications.

SUMMARY OF THE INVENTION

The present invention provides a method and circuit for maximizing the output impedance of a transconductor for $g_m$–C filters. Broadly, the circuit of the present invention senses the output conductance of the transconductor element, generates a transconductance value equal to the output conductance and subtracts the generated transconductance term from the integrator total output conductance term to maximize the integrator's output impedance.

Accordingly, in one embodiment, the present invention provides a transconductor circuit for use in transconductor-capacitor filters including an output conductance detector connected to a transconductance generator. The transconductance generator outputs a transconductance value equal to the detected output conductance. A negative conductance block receives the output of the transconductance generator and connects to a transconductor element. The negative conductance block operates to minimize the output conductance of the transconductor element. The output conductance detector senses the variable output conductance in terms of current which is fed to the transconductance generator to regenerate the sensed variable output conductance value from the current. The negative conductance block is a replica of the transconductance generator that is connected in a cross-coupled fashion to the transconductor element. By subtracting the variable output conductance term from the total differential mode output conductance equation for the transconductance element, the sizes of the transconductance transistors can be scaled such that the differential output impedance of the transconductance element can approach infinity.

A better understanding of the nature and advantages of the present invention may be had with reference to the diagrams and the detailed description below.

DESCRIPTION OF SPECIFIC EMBODIMENTS

Figure 3:
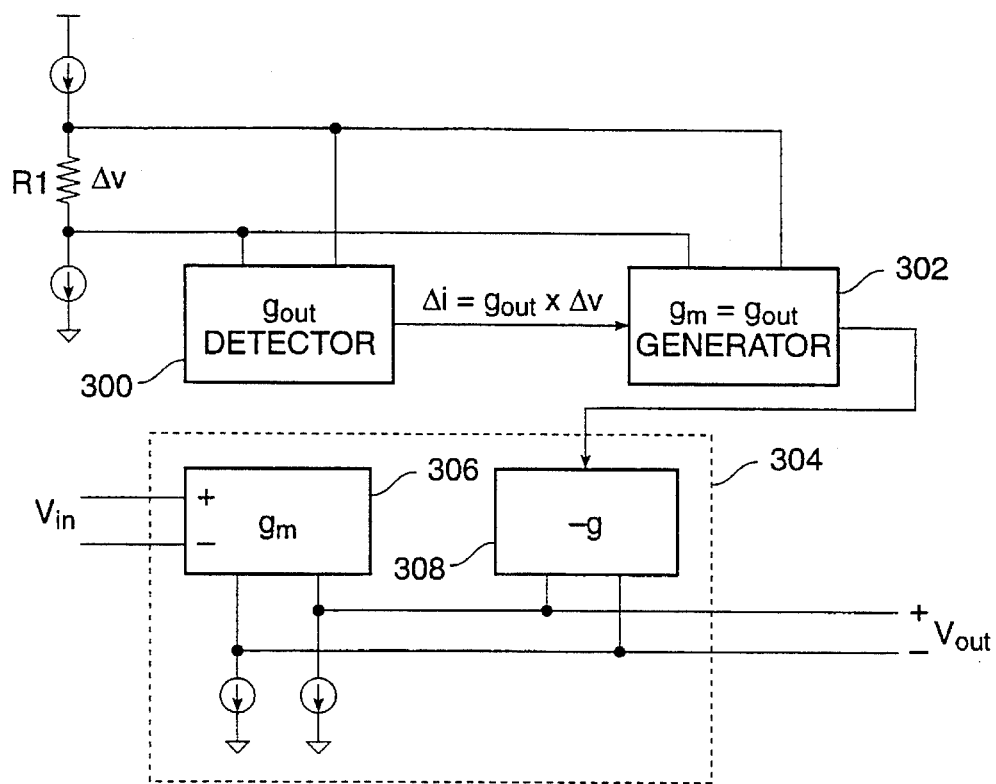
FIG. 3 is a simplified block diagram of the transconductance element according to an embodiment of the present invention.

Referring to FIG. 3, there is shown a simplified block diagram of the transconductance element according to one embodiment of the present invention. A transistor output conductance detector 300 receives a differential voltage $\Delta v$ and applies it to a circuit including transistors identical in size to those used in a target transconductor element 306. The circuit generates a current $\Delta i$ that is representative of the output impedance $r_{out}$ (or conductance $g_{out}$) of the target transistor. The current $\Delta i$ is fed into a transconductance ($g_m$) generator circuit 302 that generates a transconductance value $g_m$ equal to the output conductance $g_{out}$. The generated transconductance value is coupled to a negative-conductance (or $-g$) block 308 that replicates a complementary transconductance value equal to the transistor output conductance $g_{out}$. By coupling the $-g$ element to the output nodes of the transconductor element 306 and properly scaling the device sizes, the effects of the finite transistor output conductances can be nullified.

Figure 4:
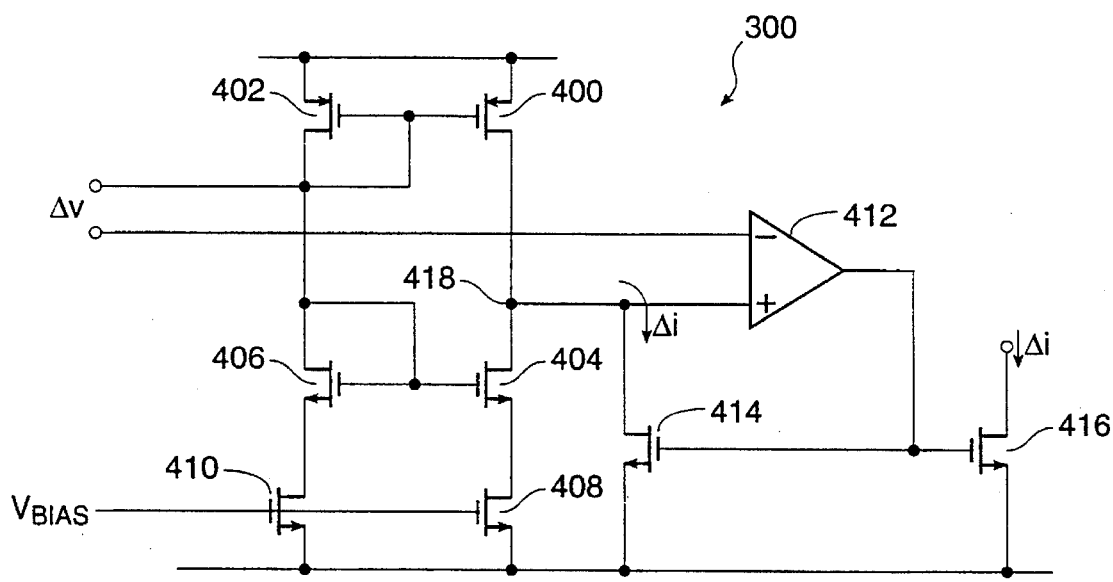
FIG. 4 shows one embodiment for the output conductance detector of the present invention.

FIG. 4 shows one circuit embodiment for the $g_{out}$ detector 300. The goal of this circuit is to provide an accurate measurement for the output conductance $g_{out}$ of transistor 400. Transistor 400 is a replica of the transconductance transistors used in the final transconductor element (e.g., transistors M1a, M2a, and M3a in FIG. 2). Transistors 402, 406 and 410 are identical to transistors 400, 404, and 408, respectively. Thus, given the same bias voltage $V_{bias}$, the same amount of current flows through both strings of transistors and the voltage at the drains of transistors 402 and 400 are therefore equal. The drain terminal of transistor 400 (node 418) connects to one input of a differential operational amplifier (opamp) 412. The other input of the opamp 412 connects to the drain terminal of transistor 402 via a resistor R1 (FIG. 3). The output of opamp 412 drives the gate of transistor 414 which connects back to node 418 at the input of the opamp 412. The voltage drop across resistor R1 creates a differential voltage $\Delta V$ between the two inputs of the opamp 412. The opamp 412 operates to equalize the voltage at its two inputs, which causes the drain-to-source voltage of transistor 400 to absorb the differential voltage $\Delta V$. The feedback loop thus forces an amount of current $\Delta i$ out of node 418 and into the drain terminal of transistor 414. The amount of the current $\Delta i$ is given by the differential voltage $\Delta V$ divided by the output impedance of transistor 400. That is, $\Delta i=(\Delta V/r_{out(400)})$, or $\Delta i=\Delta V*g_{out(400)}$. The current $\Delta i$ is replicated by transistor 416 and applied to the $g_m$ generator circuit 302.

Figure 5:
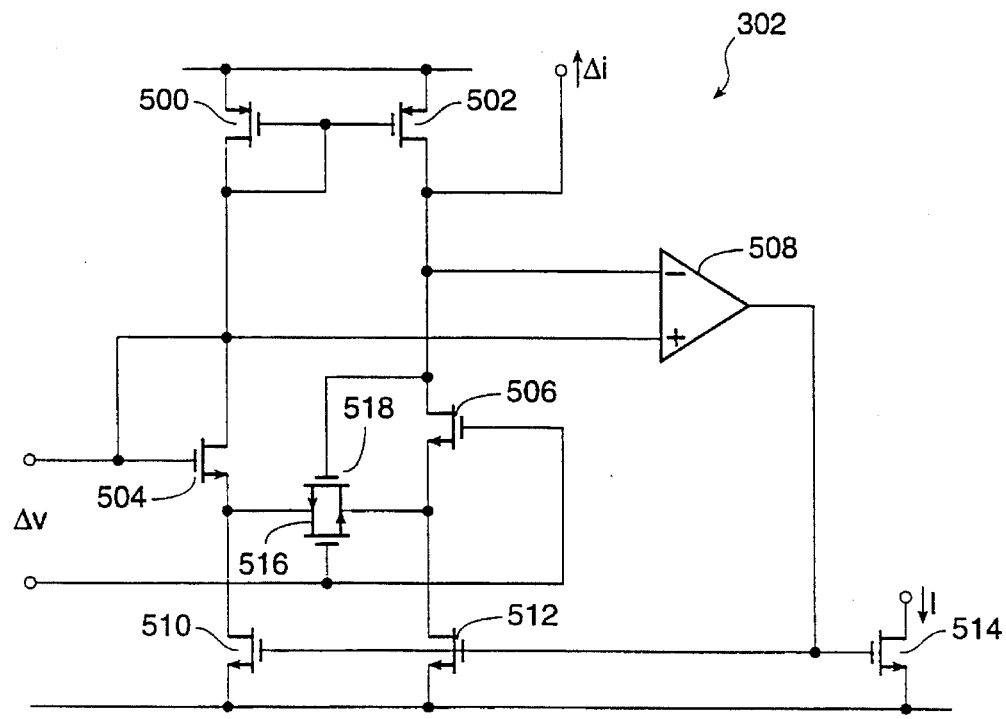
FIG. 5 shows an embodiment of the transconductance generator of the present invention.

FIG. 5 is a circuit schematic of one embodiment for the $g_m$ generator circuit 302. The principle of operation for this circuit is similar to that of the circuit in FIG. 4. Instead of applying the differential voltage $\Delta V$ across the p-channel load devices (500 and 502), $\Delta V$ is applied to the gates of two identical n-channel transistors 504 and 506. A feedback opamp 508 receives the drain of transistors 504 and 506 at its differential inputs, and drives the gate of current source transistors 510 and 512 with its output. The output of the $g_{out}$ detector 300 also connects to one input of the opamp 508. A resistive element implemented by a pair of parallel-connected transistors 516 and 518 acts as degeneration resistor for transistors 504 and 506. The inclusion of this source-degeneration resistive element improves the linearity of the transconductance of the circuit. When using a transistor-implemented resistor, the total transconductance of the circuit is determined by the bias current. Therefore, the transistor implementation ensures a constant degeneration and is preferred to a regular resistor.

In operation, $\Delta V$ creates an imbalance in the gate-to-source biasing of transistors 504 and 506 which results in an imbalance in the amount of their drain currents. The opamp 508 operates to maintain the drains of transistors 504 and 506 at the same potential. The opamp loop adjusts the current through transistors 510 and 512 such that the current imbalance in the two branches of the circuit equals the $\Delta i$ amount being extracted by the output of the $g_{out}$ detector 300. Thus, the transconductance $g_m$ (defined by $\delta I_d/\delta v_{gs}$) of the source-degenerated circuit (i.e., taking into account all four transistors 504, 506, 516, and 518) equals:

$$\Delta i/\Delta V=(\Delta V*g_{out(400)})/\Delta V=g_{out(400)}.$$

Figure 6:
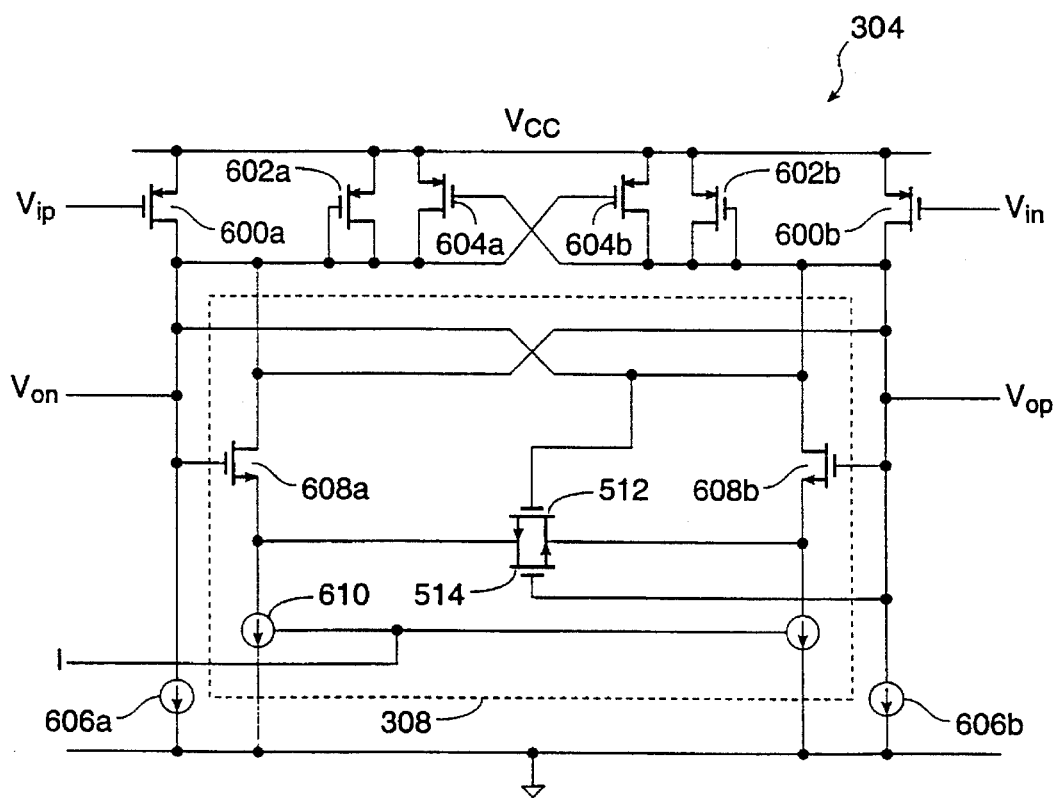
FIG. 6 shows an embodiment of the transconductor of the present invention.
Figure 1:
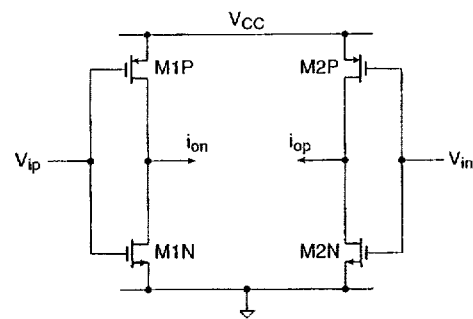
Figure 2:
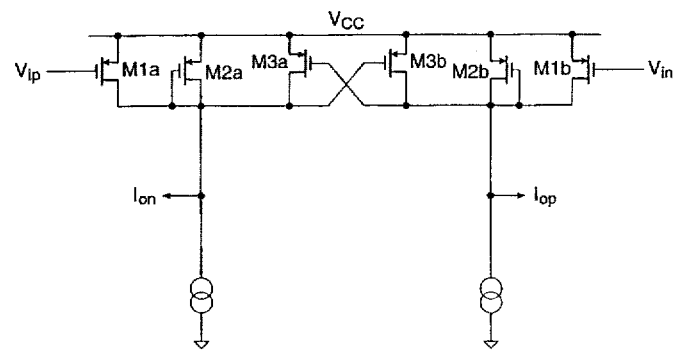
Figure 5:
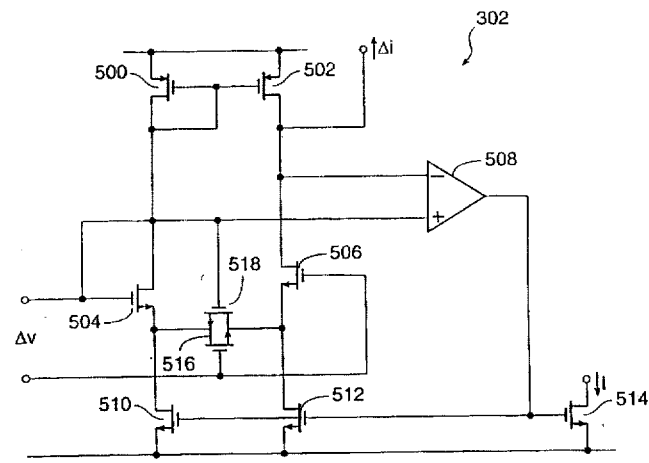
Figure 6:
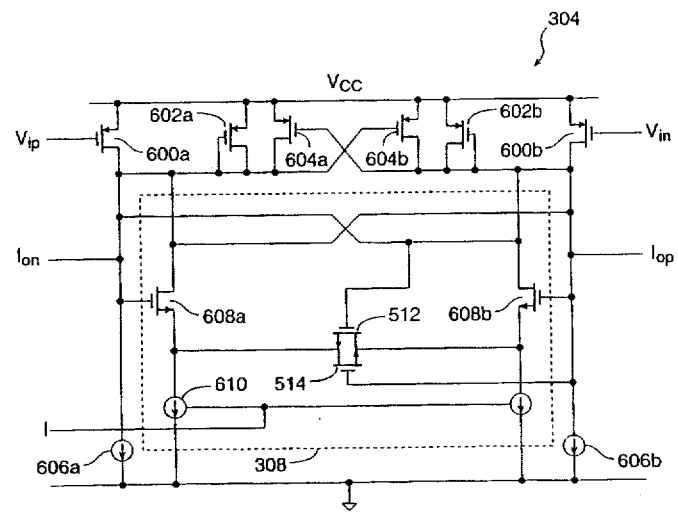

The current I through transistor 514 is the required bias current to generate an effective transconductance value that reflects the output conductance of transistor 400. This current is applied to the transconductor block 304 as shown in FIG. 3. FIG. 6 shows a circuit embodiment for the transconductor block 304, including the transconductor element 306 and the negative-conductance ($-g$) circuit 308. Similar to the transconductor element shown in FIG. 2, the transconductor element 306 includes a pair of p-channel input transistors 600a and 600b that receive a differential input signal at their gate terminals. The cross-coupled p-channel transistors 602a, 604a, and 602b, 604b are added to reduce the common-mode and increase the differential-mode output impedance. Current sources 606a and 606b control the bias the transconductance transistors 600, 602, and 604.

The transconductor bock 304 also includes the $-g$ circuit 308. This circuit includes n-channel transistors 608a and 608b that are biased by current sources 610. The current sources 610 are controlled by the output current I from the $g_m$ generator circuit 302. Thus, the combination of the four transistors 608a, 608b and 612, 614 is biased to exhibit the same $g_m$ as the four transistor $g_m$ cell (504, 506, 516, and 518) of the $g_m$ generator circuit 302. The gate terminals of transistors 608a and 608b connect to the differential output terminals Ion and Iop of the transconductor circuit, respectively, while their drain terminals connect to the output nodes in a cross-coupled fashion. Transistors 608a and 608b therefore act to inject or extract current from the output nodes in a complementary fashion as a resistor. The total differential output impedance of the transconductor element is therefore impacted by the operation of four transistor $g_m$ cell (608a, 608b, 512, and 514). The effective output conductance of the four transistor $g_m$ cell is subtracted from that of the transconductance transistors 600, 602, and 604. That is, the total differential output impedance of the transconductor element is given by:

$$R\text{out}=1/\{g_{m(602)}+[g_{out(600)}+g_{out(602)}+g_{out(604)}-g_{out(4Tcell)}]-g_{m(604)}\}$$

By scaling the sizes of transistor 400 in the $g_{out}$ detector 300, transistor 506 in $g_m$ generator 302, and transistors 600, 602, 604, and 608, the effective output conductance of the four transistor $g_m$ cell ($g_{out(4Tcell)}$) can be set equal to the sum of the output conductances of transistors 600, 602, and 604. This completely cancels out the output conductance term from the differential output impedance (Rout) equation. Thus, the value of the differential output impedance of the transconductor can become independent of the bias current variations. The transconductor circuit can be designed to achieve equal transconductance values for transistors 602 and 604. This will result in a differential output impedance for the transconductor circuit that approaches infinity.

In conclusion, the present invention provides an improved transconductor element for high frequency $g_m$–C filters. The circuit of the present invention maximizes the differential output impedance of the transconductor element by cancelling the effects of the transistor output impedances. Thus, the differential output impedance is maximized without adding an internal node which keeps the amount of high frequency phase shift to a minimum. While the above is a complete description of a specific embodiment of the present invention, it is possible to use various alternatives, modifications or equivalents. Therefore, the scope of the present invention should be determined not with reference to the above description, but, instead, should be determined with reference to the appended claims and their full scope of equivalents.

What is claimed is:

1. A transconductor circuit for use in transconductor-capacitor filters, comprising:

an output conductance detector having a transistor coupled to a reference voltage, said output conductance detector generating a signal at an output representing an output conductance of the transistor;

a transconductance generator having an input coupled to the output of the output conductance detector, and an output;

a negative conductance block having an input coupled to the output of the transconductance generator; and a transconductor element having an input coupled to an input of the transconductor circuit, and an output coupled to an output of the negative conductance block, wherein, the negative conductance block operates to minimize an output conductance of the transconductor element.

2. The transconductance circuit of claim 1 wherein the transconductor element is a differential circuit comprising a first and second differential transistors biased by a corresponding first and second current sources.

3. The transconductance circuit of claim 2 wherein the size of the transistor in the output conductance detector is scaled with respect to the size of the first and second differential transistors, whereby the signal representing the output conductance of the transistor also represents an output conductance of the first and second differential transistors.

4. The transconductance circuit of claim 3 wherein the negative conductance block comprises a third and fourth differential transistors biased by a corresponding third and fourth current sources, and wherein control terminals and output terminals of the third and fourth differential transistors couple to a first and second differential output of the transconductor element in a cross-coupled fashion.

5. Thee transconductance circuit of claim 4 wherein the third and fourth current sources are controlled by the output of the transconductance generator.

6. A differential transconductance circuit for use in transconductance-capacitance filters, comprising:

an output conductance detector having a transistor coupled to a reference voltage, said output conductance detector generating a signal at an output representing an output conductance of the first transistor;

a transconductance generator having an input coupled to the output of the output conductance detector, the transconductance generator generating a transconductance value for a second transistor at an output in response to the signal representing the output conductance of the first transistor;

a differential negative conductance block comprising a first and second differential transistors coupled to corresponding first and second current sources, the first and second current sources being controlled by the output of the transconductance generator; and a transconductor element comprising a third and fourth differential input transistors having control terminals respectively coupled to differential inputs of the transconductance circuit, and a corresponding third and fourth current sources coupled to the third and fourth differential input transistors, wherein, the first and second differential transistors are coupled in a cross-coupled fashion to a differential output of output terminals of the third and fourth differential input transistors to minimize a differential output conductance of the transconductor element.

7. A method for maximizing the differential output impedance of a differential transconductance circuit, comprising the steps of:

(a) providing a first pair of differential transconductance transistors having outputs respectively coupled to differential outputs of the transconductance circuit;

(b) detecting an output conductance value of a replica of the first pair of differential transconductance transistors;

(c) converting the output conductance value to a signal representing a transconductance value of a second transistor;

(d) replicating the transconductance value in a second pair of differential transistors;

(e) cross-coupling the second pair of differential transistors with the differential outputs of the transconductance circuit; and (f) scaling sizes of the first pair of differential transconductance transistors and the second pair of differential transconductance transistors to cancel an output conductance of the first pair of differential transconductance transistors by an output conductance of the second pair of differential transconductance transistors.

\* \* \* \* \*

UNITED STATES PATENT AND TRADEMARK OFFICE
CERTIFICATE OF CORRECTION

PATENT NO. : 5,570,049

DATED : Oct. 29, 1996

INVENTOR(S) : Chen

Figure 1:
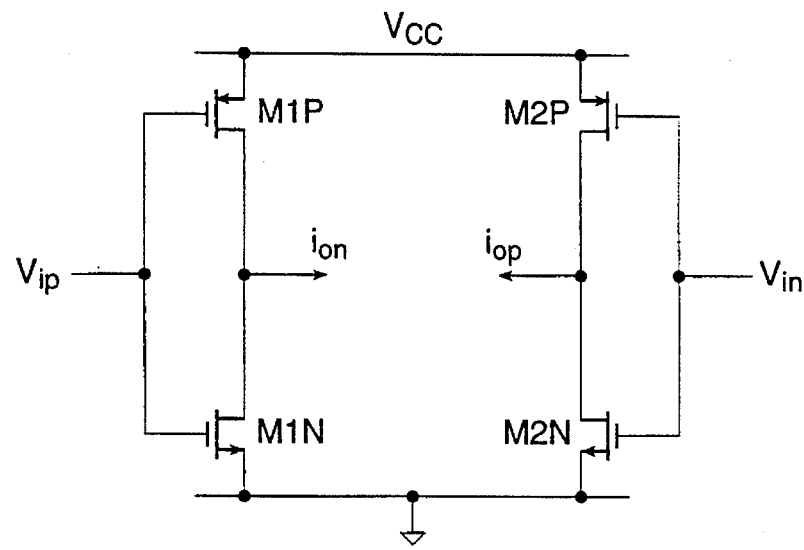
FIG. 1 shows an MOS inverter-based transconductance element.
Figure 2:
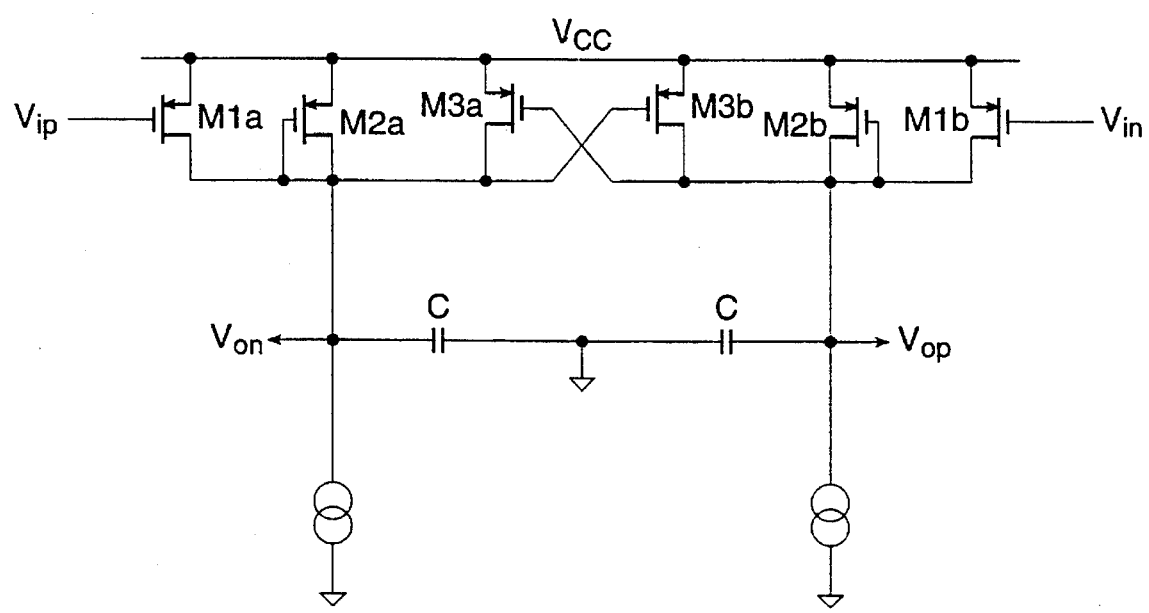
FIG. 2 shows a current-controlled transconductance element.

It is certified that error appears in the above-identified patent and that said Letters Patent is hereby corrected as shown below:

Delete Drawing Sheets 1 & 3, and substitute therefor the Drawing Sheets, consisting of FIGS. 2, 5, & 6 as shown on the attached pages.

Signed and Sealed this

Ninth Day of February, 1999

Attest:

*Attesting Officer*

*Acting Commissioner of Patents and Trademarks*